United States Patent [19]
Hau et al.

[11] Patent Number: 5,613,084
[45] Date of Patent: Mar. 18, 1997

[54] INTERPOLATION FILTER SELECTION CIRCUIT FOR SAMPLE RATE CONVERSION USING PHASE QUANTIZATION

[75] Inventors: Clarence J. Hau, Mt. Laurel; Jerome D. Shields, Atco, both of N.J.

[73] Assignee: Panasonic Technologies, Inc., Princeton, N.J.

[21] Appl. No.: 317,474

[22] Filed: Oct. 4, 1994

[51] Int. Cl.$^6$ .................................................. G06F 12/00
[52] U.S. Cl. ..................... 395/421.09; 341/61; 348/720
[58] Field of Search .......................... 395/410, 421.09; 348/708, 720, 642, 441; 341/61

[56] References Cited

U.S. PATENT DOCUMENTS

| | | | |
|---|---|---|---|
| 4,536,745 | 8/1985 | Yamaguchi et al. | 341/61 |
| 4,774,581 | 9/1988 | Shiratsuchi | 348/561 |
| 4,870,661 | 9/1989 | Yamada et al. | 375/240 |
| 5,057,911 | 10/1991 | Stec et al. | 348/642 |
| 5,274,372 | 12/1993 | Luthra et al. | 341/61 |
| 5,331,346 | 7/1994 | Shields et al. | 348/441 |
| 5,481,568 | 1/1996 | Yada | 375/340 |

*Primary Examiner*—Jack A. Lane
*Assistant Examiner*—Kevin Verbrugge
*Attorney, Agent, or Firm*—Ratner & Prestia

[57] ABSTRACT

A filter selector generates a filter address value to select one of a number of frequency characteristics of a filter to resample a first data signal from a first segment of data in order to generate second sampled data signal in a second segment of data. The filter selector includes an adder which adds a resampling factor to a previous address value to generate a current address value if the previous address value is less than a comparator value and which subtracts the comparator value from the previous address value to generate the current address value if the previous address value is greater than or equal to the comparator value. The current address value is shifted by n bits, where n is an integer, to generate the filter address value.

21 Claims, 8 Drawing Sheets

FIG. 7B

INTERPOLATION FILTER SELECTION CIRCUIT FOR SAMPLE RATE CONVERSION USING PHASE QUANTIZATION

BACKGROUND OF THE INVENTION

The present invention concerns a system for resampling, and in particular, to a digital resampling system which resamples signals using a quantized phase.

Sample re-conversion systems are well known for converting information bearing signals from one format to another format. Such systems are commonly used for data telemetry, audio signal processing, video signal processing, and video signal standards conversion.

An exemplary video signal processing system is described in U.S. Pat. No. 4,774,581 entitled TELEVISION PICTURE ZOOM SYSTEM, issued to Shiratsuchi, which is hereby incorporated by reference for its teachings on digital resampling techniques.

Another exemplary video system standards conversions system is described in U.S. Pat. No. 5,057,911 entitled, SYSTEM AND METHOD FOR CONVERSION OF DIGITAL VIDEO SIGNALS, which is hereby incorporated by reference for its teachings on digital resampling techniques.

The system described in the SYSTEM AND METHOD FOR CONVERSION OF DIGITAL VIDEO SIGNALS patent converts video signals having a normal sample rate of 13.5 MHz into a digital signal having a sample rate of 14.31818 MHz, (hereinafter 14.3 MHz) which is compatible with the National Television Standards Committee (NTSC) standard. The ratio of these two sample frequencies is exactly equal to the ratio of 33 to 35.

Accordingly, the standards conversions system described in the referenced patent generates 35 output samples for every 33 input samples it receives. This is accomplished using 35 interpolation filters which generate interpolated samples at 35 respective positions between any two of the input samples. The filter, $X(i+1)$, which is selected to generate the $i+1^{th}$ output sample is defined by equation (1).

$$X(i+1) = (X(i)+33) \, MOD \, 35 \quad (1)$$

In equation (1) 33 is the number of input samples, 35 is the number of output samples, MOD is an abbreviation of a modulo operation, X is the interpolation phase location for the current sample in the sequence, and i is the time index. The interpolation phase location defines a particular frequency response characteristic to be used to filter the input samples in order to generate the particular resampled output sample.

This technique of sample rate conversion works well when the input and output sample rates can be represented as a ratio of two relatively small numbers. When, however, the ratio of these rates cannot be represented to a high degree of precision by a manageable ratio, this conversion process may be inaccurate or unduly expensive to implement.

For example, consider a resampling circuit which converts from the CCIR (601) standard having a nominal sample rate of 13.5 MHz to the Phase Alternate Line (PAL) standard which has a sample rate of 17.734475 (hereinafter 17.7) MHz. The smallest exact ratio between these two sample frequencies is 540,000 over 709,379. Thus, if the scheme described above were used to resample the CCIR (601) signal in a PAL digital signal, 709,379 digital filters would be required. At the current state of the art, it is not practical to implement a video standards conversion system having 709,730 filters.

An alternative sampling scheme may be used where the resampling function is approximated by limiting the number of possible interpolation points. As a result, the actual interpolated point is estimated by choosing the filter that is closest to the desired interpolated point. This is known as sample phase quantization. This technique introduces a phase shift error in the signal. However, with proper quantization, this error may be acceptable.

A system employing sample phase quantization would include a fixed number of filters or a filter with a fixed number of frequency characteristics which number is designated as NPHASES. Next, the number of filters in the ideal system is quantized into the number of filters, NPHASES, for the system. This is accomplished using equations (2) and (3) below.

$$X_{i+1} = (X_i + A) \, MOD \, B \quad (2)$$

$$Q = X_{i+1} * NPHASES/B \quad (3)$$

In equations (2) and (3), B is the number of samples in the output line of the filter, A is the number of samples in the input line of the filter, and Q is the quantized phase. The quantized phase is used to determine which filter in the system is to be selected to produce the new sample.

Although equations (2) and (3) may be used to quantize the filters and phases, the equations require division and multiplication operations which are computationally expensive.

SUMMARY OF THE INVENTION

The present invention is embodied in a filter selector for generating a filter address value to select one of a number of frequency characteristics to resample first data in a first segment of data to generate second sampled data in a second segment of data. The filter selector includes a first adder for adding a resampling factor to a previous address value to generate a current address value if the previous address value is less than a comparator value and a second adder for subtracting the comparator value from the previous address value to generate the current address value if the previous address value is greater than or equal to the comparator value. The current address value is shifted by n bits, where n is an integer, to generate the filter address value.

DETAILED DESCRIPTION OF THE INVENTION

In general terms, the filter selection circuit for digital resampling operates by calculating a quantized phase value to determine which filter characteristic of a number of predetermined filter characteristics is to be used to produce an estimated output sample point from actual input samples by choosing the filter characteristic that produces a sample at a phase that is closest to the desired sample point. The system quantizes the ideal number of filter characteristics into a fixed number of filter characteristics contained in the system. This is accomplished by using a resampling factor and a specified number of bits to calculate the quantized phase. As a result, the repetitive calculation of the quantized phase is simplified to an addition operation and a simple right bit-shift operation. Thus, the necessity of repetitively performing division and multiplication operations which are computationally expensive is avoided in calculating the quantized phase.

Figure 1:
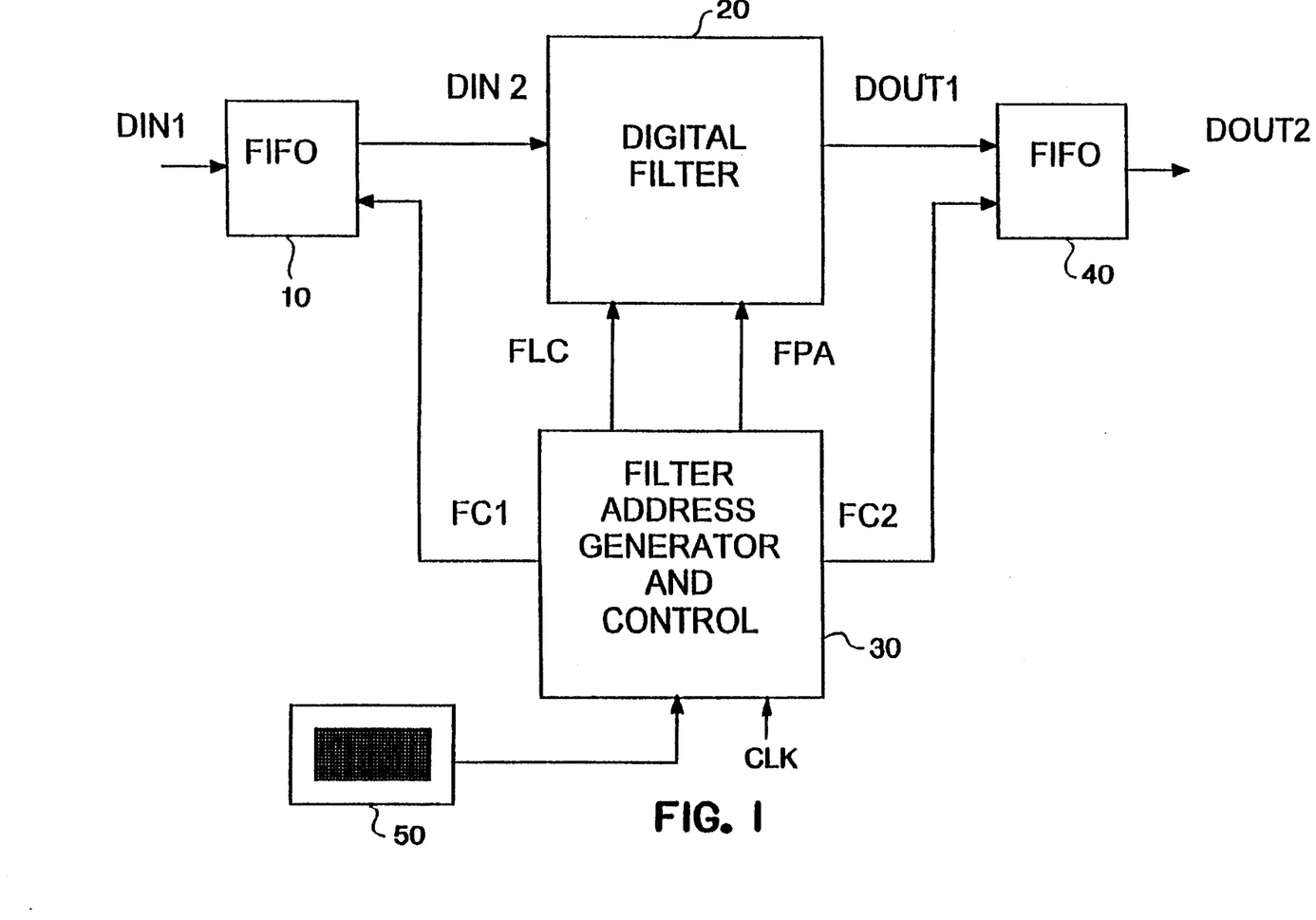
FIG. 1 is a block diagram of a sample rate conversion system in accordance with an exemplary embodiment of the present invention.

The exemplary system for implementing this filter selection circuit for digital resampling is shown in FIG. 1. In this system, a sampled data signal DIN1 is applied to a First In First Out (FIFO) memory circuit 10. Data samples are read from the FIFO 10 in response to control signal FC1 from filter address generator and control circuitry 30. In response to a clock signal CLK and calculated parameters, the generator and control circuitry 30 provides data samples from the FIFO 10 as they are needed by digital filter 20.

Digital filter 20 is a polyphase digital filter which uses samples provided by the FIFO 10 to generate new data samples of a resampled data signal DOUT1. For example, a suitable interpolation filter for use in the filtering system is shown in U.S. Pat. No. 5,331,346 entitled APPROXIMATING SAMPLE RATE CONVERSION SYSTEM issued to Shields et al., which is incorporated by reference for its teachings on interpolation filters and the circuitry to control the interpolation filter. The digital filter in reality has many programmable filter characteristics and may be programmed as a time-division multiplexed (TDM) plurality of frequency characteristics. These TDM frequency characteristics are applied in a determined sequence to generate new data samples DOUT2 which can occur at a rate that may be different from the sampled data signal DIN1 when performing sample rate conversion.

In another exemplary embodiment, the number of samples in a segment or a grid can be changed to produce a zoom in or zoom out effect. In this case, the input and output sample rates would be the same, however, the number of data sample values in a segment of data would be reduced or increased. A segment is, for example, a two dimensional portion of an image.

In another exemplary embodiment, the sample rate can be converted as well as the number of samples in a segment or grid. Such a system could be used in a wide screen television for displaying pictures in letter box format. In this case, the picture letter box format would be sample rate converted and the aspect ratio would be changed so that the picture conforms to the aspect ratio of the wide screen television.

Other special effects as are well known to those of ordinary skill in the art, such as warping of the picture, could be produced using the digital resampling system.

The digital filter 20 produces a new output data sample using the input data samples provided by FIFO 10. The digital filter uses a selected frequency characteristic to filter the input data samples to produce the new output data samples. The frequency characteristic is selected in response to a filter phase address location signal FPA from the generator and control circuitry 30. The resampled data values DOUT1 are supplied to a second FIFO memory 40 which, in turn, supplies the new data samples DOUT2 in response to a control signal FC2 from the generator and control circuitry 30.

The generator and control circuitry 30 determines which of the plurality of the frequency characteristics of the polyphase digital filter 20 is used at a given time as provided by the signal FPA.

The generator and control circuitry 30 determines which frequency characteristic to select using equations (4) and (5) below.

$$X(i+1)+(X)(i)+C) \bmod (NPHASES*2^{nbits}) \qquad (4)$$

$$Q=X(i+1)>>nbits \qquad (5)$$

The variables in equations (4) and (5) are X, the interpolation phase location, nbits, the number of bits for the phase quantization of the system, NPHASES, the fixed number of filters in the digital filter 20, i, the time index, Q, the quantized phase location, and C, the resampling factor. The >> operation in equation (5) is a right bit shift operation. nbits is selected to produce a desired resolution in the quantized phase location X. As the value of nbits is increased, the resolution of the quantized phase increases. The value of nbits is, however, limited by the size and speed of the adders required to implement equation (4). As the value of nbits increases the size of the adders increases and as a result, the speed of the adders may decrease.

Equations (4) and (5) replace conventional equations (2) and (3). The ratio of the input sample rate value A and the output sample rate value B of equation (2) is preserved in the resampling factor value C. The ratio of the input sample rate value A to the output sample rate value B is expressed in equation (6) below.

$$A/B \equiv C/(NPHASES*2^{nbits}) \qquad (6)$$

Accordingly, the resampling factor C is determined by equation (7) below.

$$C=(A/B) * NPHASES * 2^{nbits} \qquad (7)$$

The resampling factor is calculated once for a particular input sample rate value A and an output sample rate value B. The resampling factor can be calculated by generator and control circuitry 30 prior to resampling or provided to generator and control circuitry via input circuitry 50. As a result, the quantized phase is calculated for different input samples according to equations (4) and (5) using addition and bit shift operations, thus avoiding the repetitive use of the computationally expensive division and multiplication operations of equations (2) and (3).

Alternatively, A is the number of samples provided to the digital filter in a first predetermined segment and B is the number of samples produced by the digital filter in a second predetermined segment. In one exemplary embodiment where zooming is performed, the first and second segments are equal but the number of data values in the first and second predetermined segments are different to produce a zooming effect.

The operation of the address generator and control circuitry shown in FIG. 1 which implements the above equations is illustrated with reference to the flow-chart diagram shown in FIG. 2.

The steps described below determine the resampling factor C used to calculate the quantized phase and a number of data samples SAMP_IN which must be provided to the digital filter 20 by FIFO 10 to produce a valid new data sample. This calculation is performed once by the generator and control circuitry 30 prior to resampling. Then, new data samples are produced by repetitively using equations (4) and (5) to determine the quantized phase location without repetitively performing the division and multiplication operations of equations (2), (3), and (4).

When down sampling, (i.e. producing a fewer number of output samples than input samples) the number of data samples SAMP_IN provided to the digital filter is determined by a multiplication coefficient value m and whether a carryout is generated in calculating the resampled data. The multiplication coefficient value is the integer portion of the input sample rate divided by the output sample rate. When upsampling, (i.e. producing a larger number of output samples than input samples) a sample is provided to the digital filter when a carryout is generated in calculating the resampled data.

In another exemplary embodiment where zooming is performed, A is the number of samples in an input line or segment and B is the number of data samples in an output line or segment.

The first step in the process illustrated by this flow-chart, step 410, obtains input variables from input circuitry 50, shown in FIG. 1, used by the control and address circuitry 30. The input variables are A, the input sample rate, B, the output sample rate, NBITS, the number of bits for the phase quantization of the system, and NPHASES, the maximum number of filters in the digital filter 20.

At step 412, the process next determines whether the input sample rate A is greater than the output sample rate B. If the value of A is greater than the value of B, then down sampling is performed. If the value of A is less than the value of B, then upsampling is performed.

If the input sample rate A is greater than the output sample rate B, a multiplication co-efficient m, where m is an integer, is calculated at step 432. The multiplication coefficient value is calculated so that it can be determined how many data samples must be provided to the digital filter to produce valid resampled data. For example, if the multiplication coefficient m is two, at least two samples values are provided to the filter 20 to produce a resampled output value.

At step 432, the multiplication coefficient value m is determined according to equation (8) below.

$$M = \text{Int}(A/B) \quad (8)$$

Int takes the integer portion of A divided by B.

Then, at step 424, the input sample rate value A is set to be equal to the input sample rate value A minus the multiplication coefficient value m multiplied by the output sample rate value B as shown in equation (9).

$$A = A - m * B \quad (9)$$

The new calculated value A is then used, at step 428, to calculate the re-sampling factor value C shown in equation (10) below.

$$C = (A/B) * \text{NPHASES} * 2^{nbits} \quad (10)$$

The multiplication factor m is also used to determine the number of sample data to be provided to the digital filter 20 at any sampling instant to generate a new data sample at step 440. For the embodiment shown in FIG. 1, for example, the generator and control circuitry 30 would control FIFO 10 using control signal FC1 to provide m sample data values DIN2 to the digital filter for each output sample DOUT1 produced by the filter in accordance with the value of SAMP_IN.

In addition, the generator and control circuitry 30 would also provide a control signal FC2 to FIFO 40 to control which of the new data samples DOUT1 are accepted by FIFO 40. For example, suppose down sampling is performed and the value SAMP_IN is two. The digital filter 20 produces a valid new data sample for every two data samples supplied to it. An invalid new data sample will be produced every other valid input sample, however, because the filter 20 produces a resampled data value DOUT1 for each data sample DIN2 provided to it. The invalid data samples produced between the new valid data samples are discarded. The address generator and control 30 provides a control signal FC2 to FIFO 40 to discard a new data sample DOUT1 when it is invalid. The new data samples DOUT1 are discarded until the correct number of data samples have been provided to digital filter 20 to produce a valid new data sample DOUT1. In this case, two samples are provided to digital filter 20 to produce each valid new data sample.

In addition, as discussed later, a quantized phase location which is provided to the digital filter 20 as an address to select a particular frequency characteristic, is valid even though the corresponding new data sample is invalid and will be discarded. Accordingly, the quantized phase location is retained and used again after an additional sampled data value is provided to digital filter 20.

Alternatively, it is contemplated that digital filter 20 could be replaced with another digital filter which does not produce a new data sample until the correct number of data samples have been provided to the digital filter.

If, at step 412, it is determined that the input sample rate A is not greater than the output sample rate B, then, at step 420, the multiplication factor m is set equal to 0. Accordingly, the original input sample rate A is subsequently used at step 428 to calculate the resample factor C.

In this case, where the value m is equal to zero and upsampling is performed, a data sample is provided to the digital filter if a carryout is generated in the generator and control circuitry 30. The generation of the carryout and the shifting in of the next data sample is explained later. In this case, each new data sample DOUT1 is valid.

Figure 3:
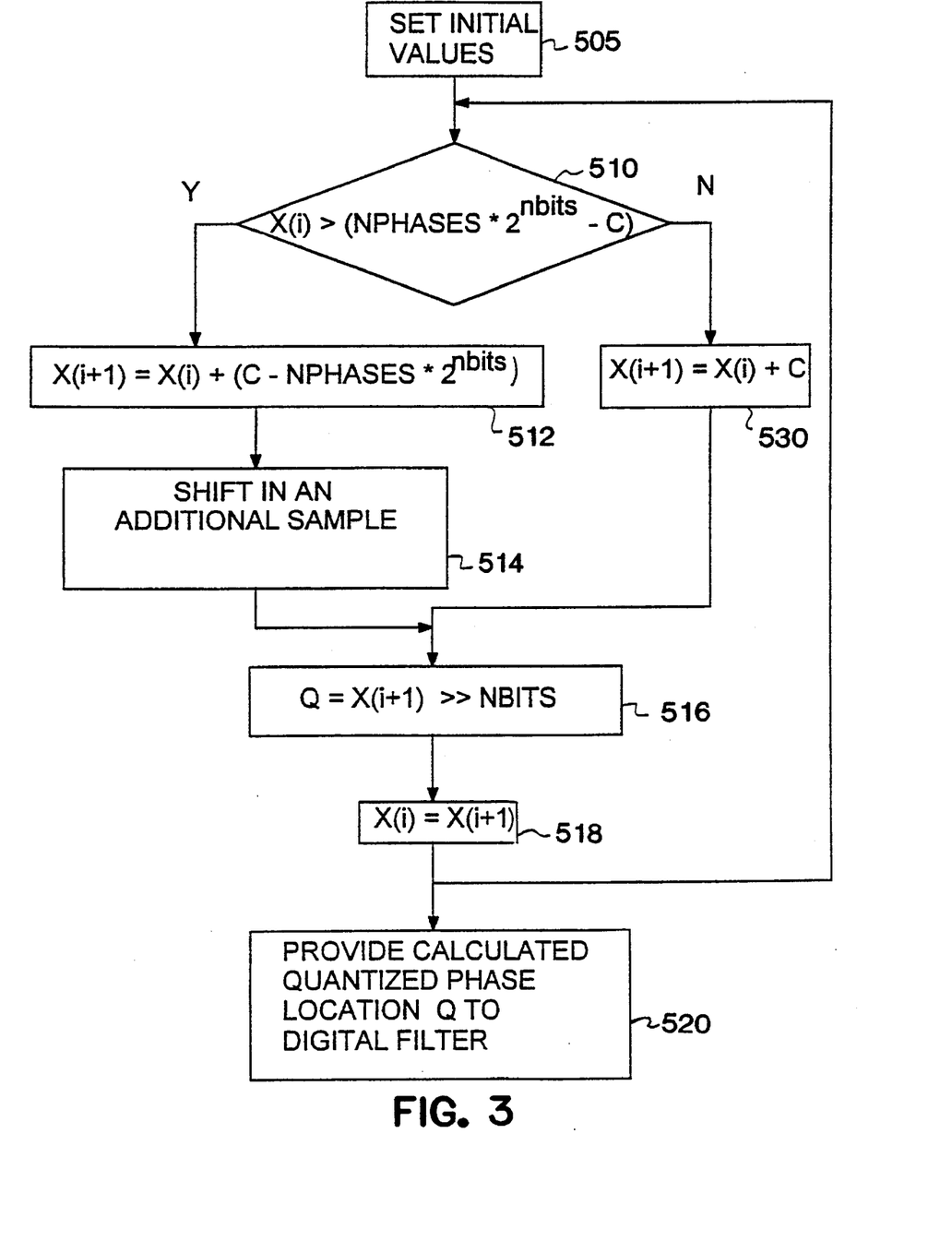
FIG. 3 is a flow chart diagram which is useful in explaining the operation of the filter address generator and control circuitry according to the first exemplary embodiment of the invention.

Once the resampling factor has been calculated, it is used to calculate the quantized phase. As shown in FIG. 3, at step 505, the interpolation phase X(i) is set equal to an initial value INT_VAL, for example, zero. The initial value INT_VAL may be is selected according to the resampling application which the filter selection circuit is used. One of ordinary skill in the art in this field, given the particular resampling application for which the filter selection circuit is used and the filter selection circuit as described in this application would be able to determine the appropriate initial value for the interpolation phase location value X(i). The initial value INT_VAL could be provided to the address and control circuitry using input circuitry 50 shown in FIG. 1.

At step 510, the current interpolation phase location value X(i) is compared to the value of the expression (11) below.

$$NPHASES * 2^{nbits} - C \qquad (11)$$

The multiplication of NPHASES by $2^{nbits}$ is a left shift of NPHASES by nbits, thus, avoiding a multiplication operation.

If it is determined that the value of X(i) is greater than or equal to the value of equation (11), then the next interpolation phase value X(i+1) is determined by equation (12) below.

$$X(i+1) = X(i) + (C - NPHASES * 2^{nbits}) \qquad (12)$$

Then, at step 514, the next data sample data is shifted into the digital filter 20.

Alternatively, if at step 510 it is determined that the interpolation phase location value X(i) is not greater than the value of equation (11), then the interpolation phase X(i+1) is determined by equation (13) below at step 530.

$$X(i+1) = X(i) + C \qquad (13)$$

Then, at step 516, quantized phase value Q is set equal to the interpolation phase location value X(i+1) shifted right by the value of nbits.

The quantized phase is then provided to the digital filter 20, at step 520, as the filter phase location signal FPA. At step 518, the interpolation phase location value X(i) is set equal to the interpolation phase location value X(i+1) and provided to step 510.

Figure 4:
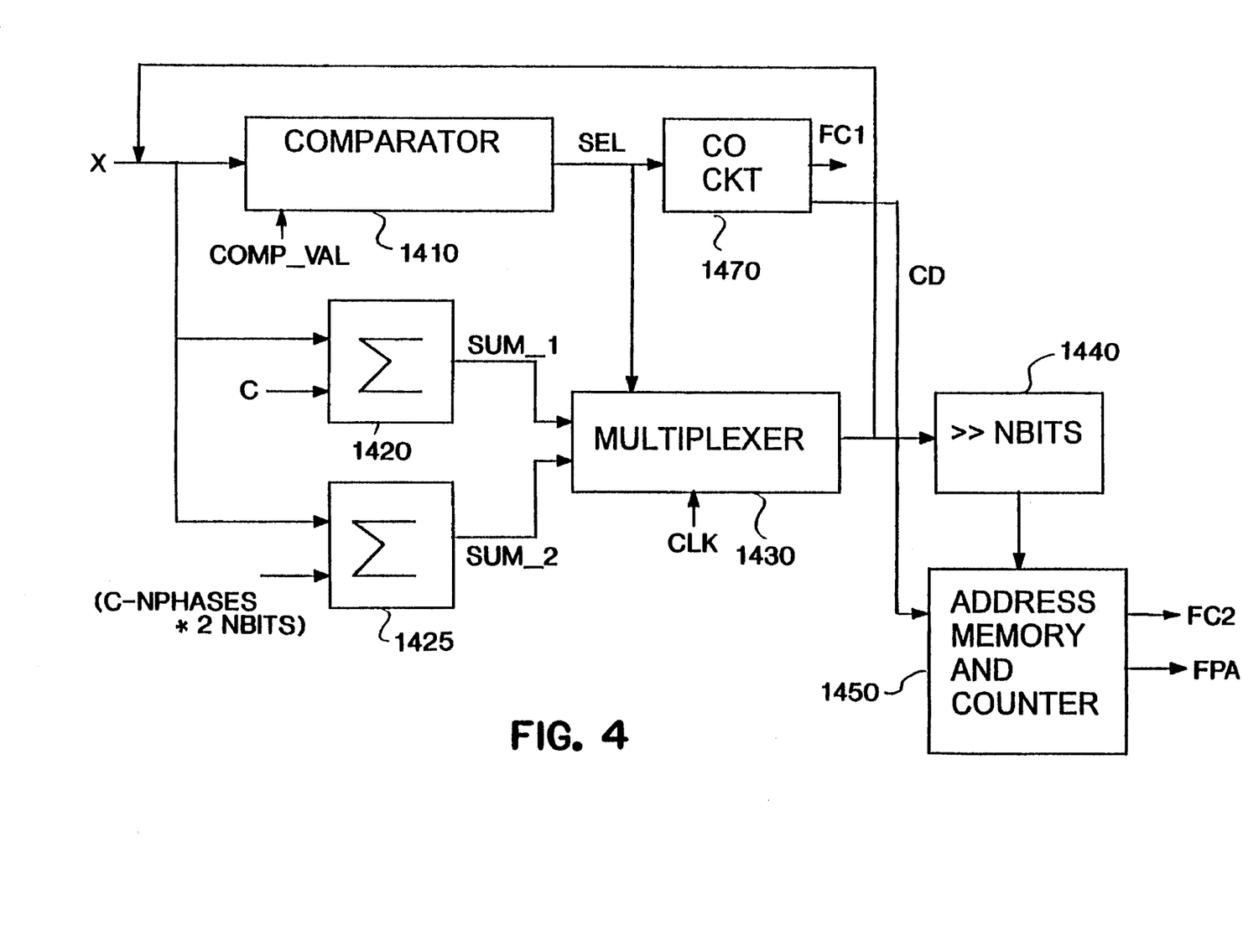
FIG. 4 is a block diagram of the filter address generator and control shown in FIG. 1 according to the first exemplary embodiment of the invention.

A specific example of this sampling technique is described below with reference to FIG. 4. FIG. 4 shows an exemplary implementation of the filter address generator and control circuitry 30 shown in FIG. 1.

In FIG. 4, the interpolation phase location for a current sample is determined. An interpolation phase location value X(i) is provided to comparator 1410 to determine if the value of X(i) is greater than or equal to a comparator value COMP_VAL determined by equation (14) below.

$$COMP\_VAL = NPHASES * 2^{nbits} - C \qquad (14)$$

If the value of X(i) is not greater than the value of COMP_VAL, then the value of SUM_i produced by adder 1420 is selected by multiplexer 1430 in response to a select signal SEL from comparator 1410. The value of X(i) is added to the re-sample factor value C at adder 1420.

Alternately, if the interpolation phase location value X(i) is greater than or equal to the value of COMP_VAL, multiplexer 1430 selects the value of SUM_2 provided by adder 1425 in response to a select signal SEL from comparator 1410. At adder 1425 SUM_2 is calculated by equation (15) below.

$$SUM\_2 = X(i) + (C - NPHASES * 2^{nbits}) \qquad (15)$$

The new interpolation phase location value X(i+1) provided by multiplexer 1430 is supplied as an input to comparator 1410 and as an input to the shifter 1440. Comparator 1410 uses the new interpolation phase location value X(i+1) as the current interpolation phase location value X(i) to calculate the next value of X(i+1).

When down sampling, if the value of X(i) is not greater than the value of COMP_VAL, then the corresponding resampled data produced by the digital filter is valid. If the interpolation phase location value X(i) is greater than or equal to the value of COMP_VAL, when down sampling, however, the corresponding new data sample is not valid and will be discarded by FIFO 40 in response to a control signal FC2 provided by carryout toggle circuitry 1470. The carryout toggle circuitry generates control signals FC1 and CO in response to the signal SEL provided by comparator 1420. The filter phase address location signal FPA is retained in the address memory and counter 1450 and provided again to digital filter 20 in response to signal CO to calculate the next resampled data value DOUT1 after the next data sample DIN2 is provided to digital filter 20 as shown in FIG. 1.

In addition, the address and counter circuitry maintains a count so that the new data samples provided by digital filter 20 can be provided to FIFO 40, shown in FIG. 1, or discarded in response to signal FC2 provided by address memory counter 1450. The digital filter, after producing a resampled data value does not immediately provide the new data sample to FIFO 40. Accordingly, the count is maintained so that as the new data samples are provided to FIFO 40, control signal FC2 can be used to direct which new data samples FIFO 40 accepts.

When a carryout has been generated, the generator and control circuitry provides a control signal FC1 to FIFO 10 to shift in the next data sample. Then, the generator and control circuitry 30 repeats the previous filter phase address location signal FPA which has been stored in the address memory and control circuitry 1450 to produce the new data sample.

Figure 7A:
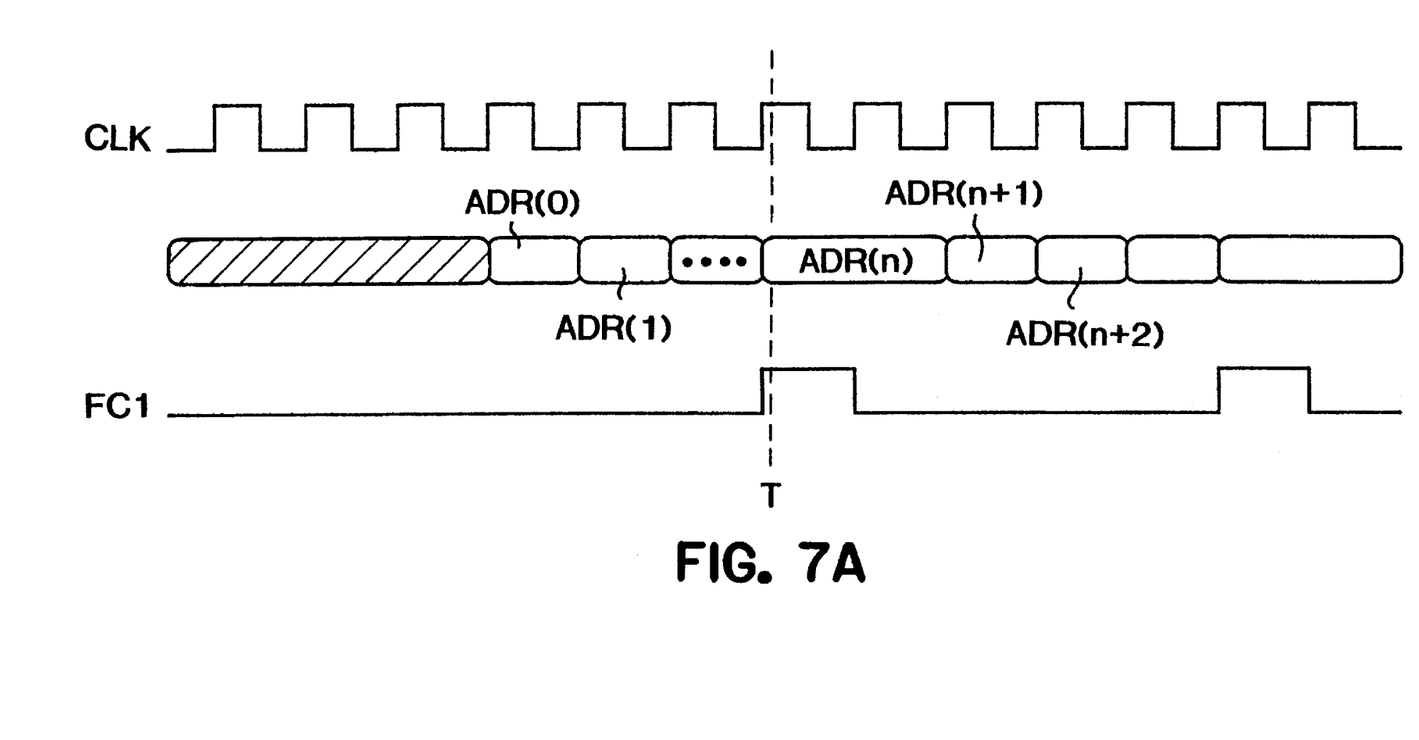
FIG. 7a is a timing diagram illustrating the operation of the filter address generator shown in FIG. 4.

This is illustrated in the timing diagram shown in FIG. 7a. For example, the filter phase address location "ADR(n)" is used by the digital filter 20 to select a frequency characteristic to produce a new data sample. If a carryout has been generated, as shown at time T, then, the next sampled data value is provided to digital filter 20 and filter phase address location ADR(n) is reused by the digital filter 20 to produce the new data sample using the next data sample. In addition, a control signal FC2 is subsequently provided to FIFO 40 to discard the new data sample which was calculated when the carryout was generated.

When upsampling, FIFO 40 accepts new data samples whether the value of X(i) is less than, greater than, or equal to the value of COMP_VAL. FIFO 10, however, does not shift in the next sampled data if the value of X(i) is not greater than the value of COMP_VAL. Digital filter 30 calculates the next new data sample using the data samples it already contains. The next data sample value DIN2 is provided to digital filter 30 from FIFO 10 if the interpolation phase location value X(i) is greater than or equal to the value of COMP_VAL.

The shift register 1440 shifts the value of X(i+1) right by the value of nbits (i.e. divides X(i+1) by $2^{nbits}$) to produce a quantized phase value Q. The value of Q is provided to digital filter 20 as the filter phase address location signal FPA which uses the filter phase address location signal FPA to select a frequency characteristic of the digital filter 20 to filter the current data samples.

The operation of the address generator and control circuitry shown in FIG. 1 according to a second exemplary embodiment of the invention is illustrated with reference to the flow-chart diagram shown in FIG. 5.

When the value of NPHASES multiplied by the value of $2^{nbits}$ is large, it may be difficult to implement the adders shown in FIG. 4 to operate at high speed. This problem is mitigated by dividing the steps used to implement equation (3) into two separate steps. As a result, the adders used to implement the separated steps are smaller and the speed of the filter address generator and control circuitry 30 can be increased.

The generator and control circuitry 30 according to the second exemplary embodiment uses equations (16), (17) and (18) below to calculate the quantized phase value.

$$X(i+1)=(X(i)+ZI+COY) \bmod NPHASES \quad (16)$$

$$Y(i+1)=(Y(i)+ZF) \bmod m \quad (17)$$

$$COY=(Y(i)+ZF) \geq m \quad (18)$$

The variables in equations (16) (17), and (18), are X, the interpolation phase location, NPHASES, the fixed number of filters in the digital filter 20, i, the time index, Y, the adder value, m, the size of the adder calculating the value of Y(i) added to ZF, and COY, a carryout produced by the adder calculating the value of Y(i) added to ZF. The $\geq$ in equation (18) is a logical operation which is only used to express an overflow, a carryout, produced by the adder which adds Y(i) to ZF. If a carryout COY is produced, it is used in equation (16) to calculate the interpolation phase location. ZI is the r most significant bits of the resampling factor C and ZF is the r minus one (r−1) least significant bits of the resampling factor C as shown in equations (19) and (20) where the resampling factor C has s bits and r is equal to the value of nbits.

$$ZI=C[s:r] \quad (19)$$

$$ZF=C[(r-1):0] \quad (20)$$

Figure 2:
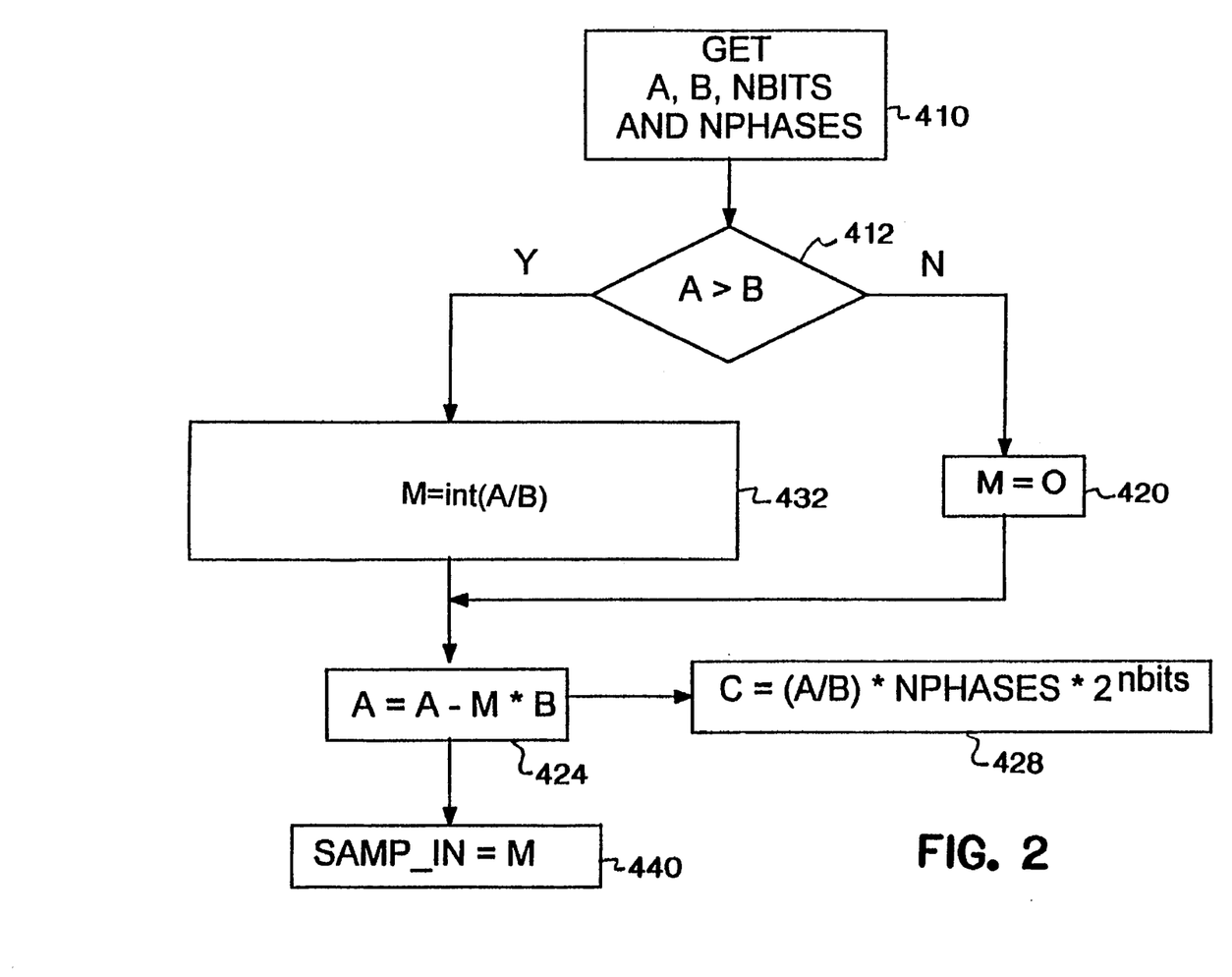
FIG. 2 is a flow chart diagram which is useful in explaining the operation of the filter address generator and control circuitry according to a first exemplary embodiment of the invention.

The resampling factor is determined using equation (7) and is illustrated in by the flow-chart in FIG. 2.

The resampling factor is calculated once for a particular input sample rate value A and a output sample rate value B. As a result, the quantized phase repetitively calculated for different input samples is determined according to equations (16) and (17) using addition and bit shift operations, thus avoiding the use of the computationally expensive division and multiplication operations.

Figure 5:
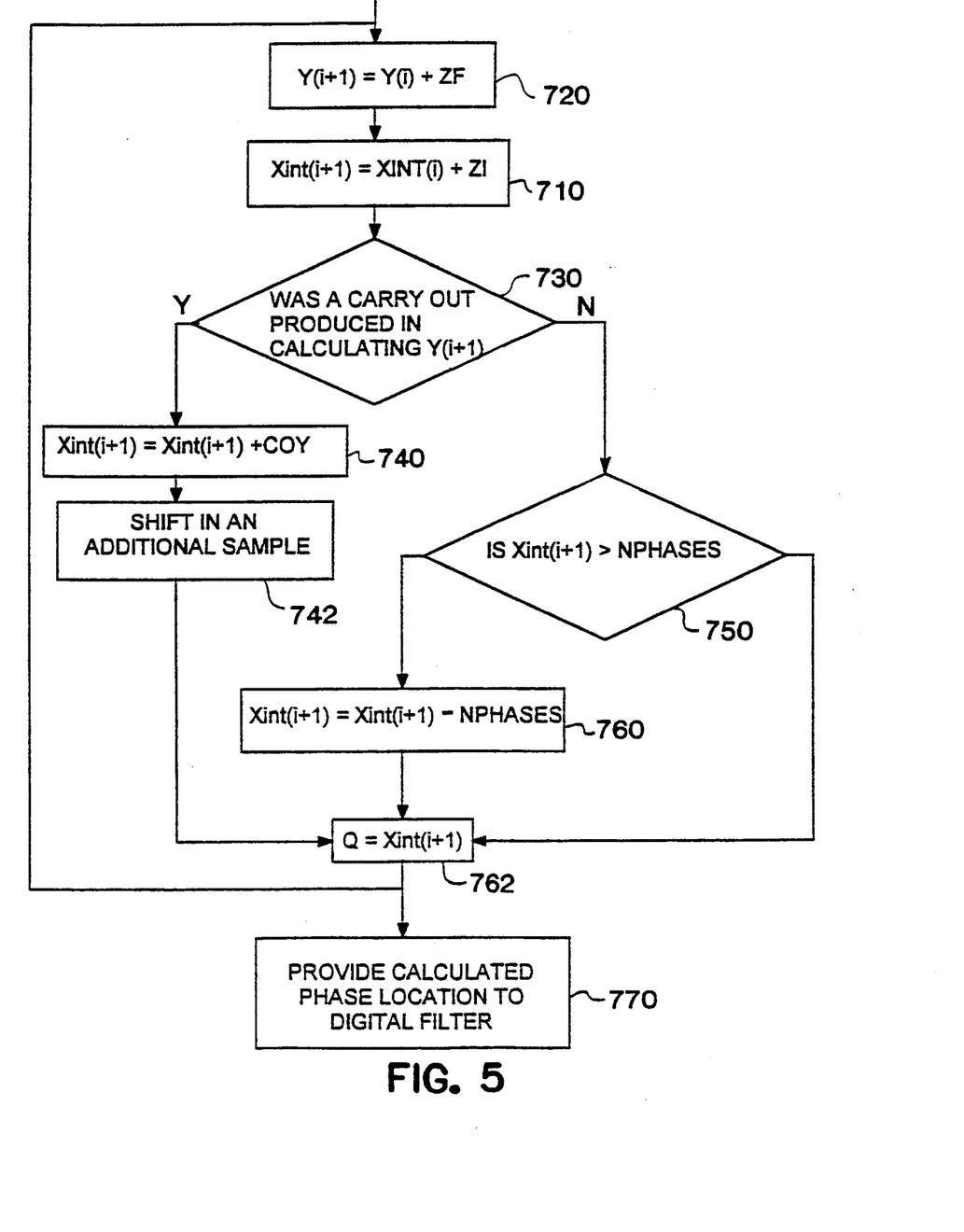
FIG. 5 is a flow chart diagram which is useful in explaining the operation of the filter address generator and control circuitry according to a second exemplary embodiment of the invention.

Implementation of equations (16) and (17) are illustrated by the flow-chart in FIG. 5.

The first two steps 710 and 720 in the process, after the resampling factor value C has been calculated, calculates the values of Xint(i+1) and Y(i+1) according to equation (21) below and equation (17) above respectively.

$$Xint(i+1)=Xint(i)+ZF \quad (21)$$

Next, at step 730, it is determined if a carryout COY has been produced using equation (18). Xint(i+1) is recalculated at step 740 according to equation (22) below if a carryout COY has been produced.

$$Xint(i+1)=Xint(i+1)+COY \quad (22)$$

Alternatively, the calculation of Xint(i+1) could be delayed until the value of Y(i+1) is calculated. Then when the value of Xint(i+1) is calculated, COY is provided to determine Xint(i+1) according to equation (11).

At step 742, the next data sample is provided to the digital filter 20, shown in FIG. 1, and the value of quantized phase location is set equal to the value of Xint(i+1) at step 762. Alternatively, if a carryout COY was not produced at step 720, then, at step 750, it is determined if the value of Xint(i+1) is greater than or equal to the value of NPHASES. If the value of Xint(i+1) is less than the value of NPHASES, then the quantized phase value Q is set equal to the value of Xint(i+1). However, if the value of Xint(i+1) is greater than or equal to the value of NPHASES, then Xint(i+1) is calculated, at step 760, according to equation (23) below.

$$Xint(i+1)=Xint(i+1)=NPHASES \quad (23)$$

Then, the quantized phase value Q is set equal to the value of Xint(i+1) at step 762.

Then, at step 770, the filter phase address location signal FPA corresponding to the quantized phase value Q is provided to digital filter 20 to choose the frequency characteristic. Finally, the value of Xint(i+1) is used as the value of Xint(i) at step 710 to repeat the process.

Figure 6:
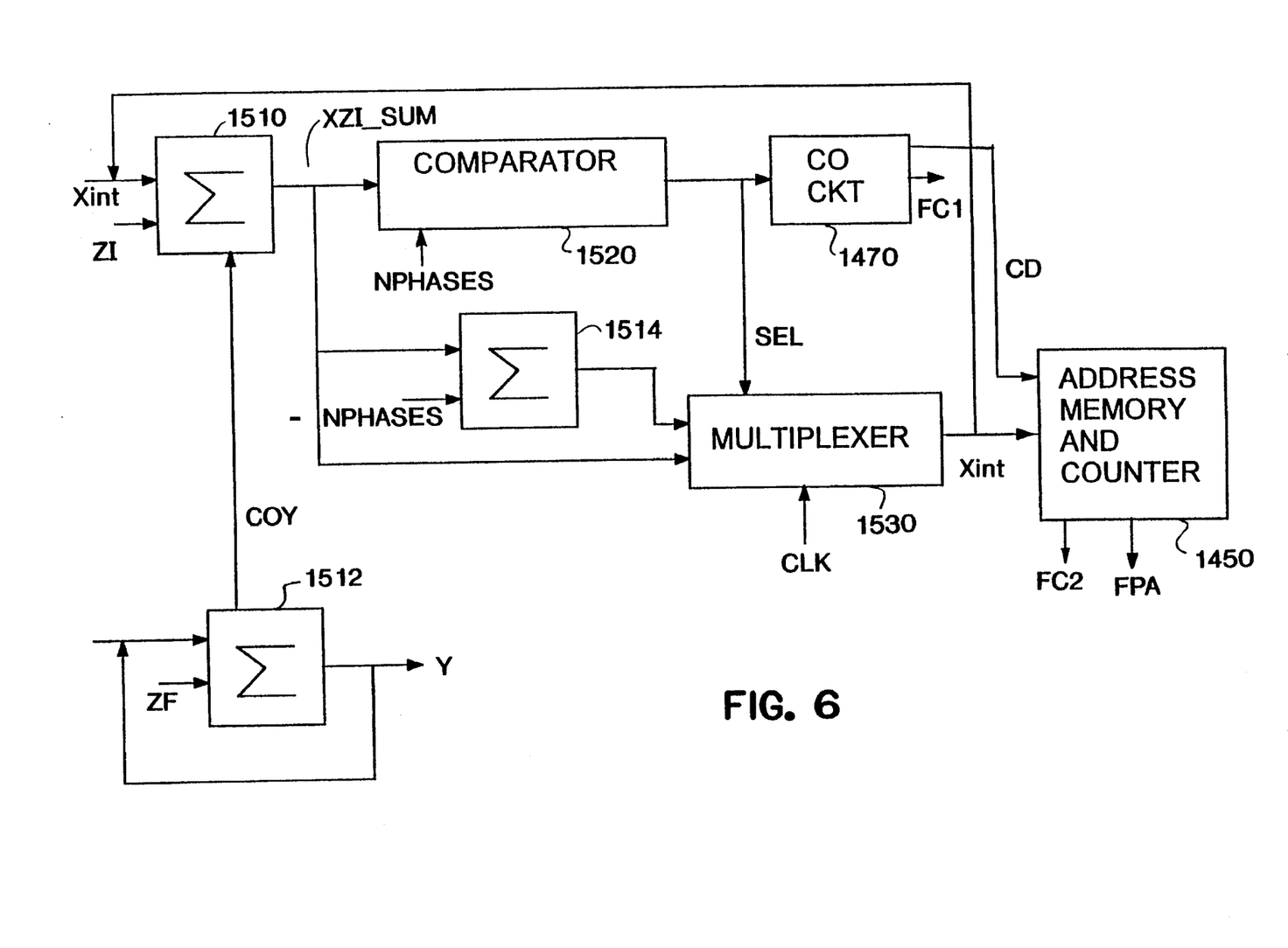
FIG. 6 is a block diagram of the filter address generator and control shown in FIG. 1 according to the second exemplary embodiment of the invention.

A specific example of this method according to the second exemplary embodiment is described below with reference to FIG. 6. FIG. 6 shows the filter address generator and control circuitry 30 shown in FIG. 1.

A first adder 1510 is supplied with the r most significant bits of the resampling factor data C as the value ZI where r is determined according to equation (19) and (20). The value of ZI is added to the value of Xint(i) to produce the value of XZI_SUM.

In addition, adder 1512 is supplied with the r minus 1 (r−1) least significant bits of the resampling factor data C as the value ZF. The adder 1512 adds the value of RF with the value of Y(i). If this addition produces a carryout value COY, the value of COY is provided to adder 1510 to be added to the values of ZI and Xint(i) to produce the value of XZI_SUM. The value of Y is also provided as an input to adder 1512.

Figure 7B:
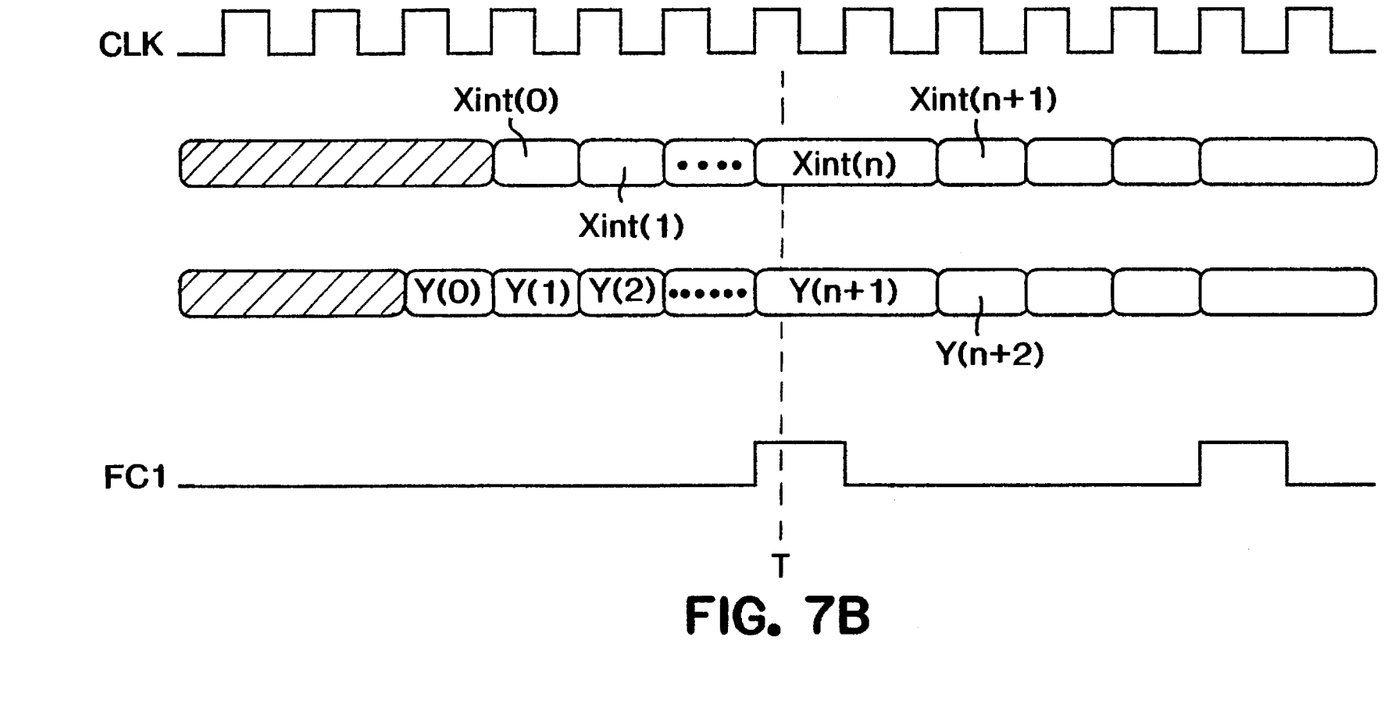
FIG. 7b is a timing diagram illustrating the operation of the filter address generator shown in FIG. 6.

As shown in the timing diagram in FIG. 7b, the adder 1512 is started prior to adder 1510. As a result, if adder 1512 generates a carryout COY, the carryout COY can be provided to adder 1510 to be added to the corresponding values of Xint(i) and ZI.

The initial values of Y and X are selected according to the particular application of the resampling circuit. One of ordinary skill in the art given the circuitry described in this application, would be able to determine the initial values of Y and X for the particular application.

The value of XZI_SUM is compared to the value of NPHASES at comparator 1520. If the value of XZI_SUM is less than the value of NPHASES, multiplexer 1530 selects the value XZI_SUM and provides it as an output Xint(i+1) in response to a select signal SEL from comparator 1520. If the value of XZI_SUM is greater than or equal to the value of NPHASES, multiplexer 1530 selects the value of NPHASES subtracted from XZI_SUM at adder 1514 and provides it as an output Xint(i+1) in response to the select signal SEL supplied by multiplexer 1530.

The output value Xint(i+1) provided by multiplexer 1530 is provided to the digital filter 20 via the filter phase address location signal FPA to identify a frequency characteristic in the digital filter 20 which is to be used to filter the data samples. The output value Xint(i+1) provided by multiplexer 1530 is also provided as an input value to adder 1510.

The address memory and counter 1450 and carryout toggle circuitry 1470 perform the same functions as the corresponding reference numerals in FIG. 3.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A filter selector for generating a filter address value to select one of a plurality of filter characteristics to resample first data from a first segment of data to generate second sampled data in a second segment of data, the filter selector comprising:

means for adding a resampling factor to a previous address value to generate a current address value if the previous address value is less than a comparator value;

means for subtracting the comparator value from the previous address value to generate the current address value if the previous address value is not less than the comparator value; and means for shifting the current address value by nbits bits to generate the filter address value where nbits is an integer and defines a number of bits for a phase quantization.

2. The filter selector as recited in claim 1, further including means for comparing a previous address value with the comparator value.

3. A filter selector for generating a filter address value to select one of a plurality of filter characteristics to resample first data from a first segment of data to generate second sampled data in a second segment of data, the filter selector comprising:

means for adding a resampling factor to a previous address value to generate a current address value if the previous address value is less than a comparator value;

means for subtracting the comparator value from the previous address value to generate the current address value if the previous address value is not less than the comparator value; and means for shifting the current address value by nbits bits to generate the filter address value where nbits is an integer and defines a number of bits for a phase quantization;

wherein there are NPHASES phases of the plurality of filter characteristics and wherein the comparator value is determined by the expression:

$$\text{NPHASES} * 2^{nbits} - C$$

where C is a resampling factor value.

4. A filter selector for generating a filter address value to select one of a plurality of filter characteristics to resample first data from a first segment of data to generate second sampled data in a second segment of data, the filter selector comprising:

means for adding a resampling factor to a previous address value to generate a current address value if the previous address value is less than a comparator value;

means for subtracting the comparator value from the previous address value to generate the current address value if the previous address value is not less than the comparator value; and means for shifting the current address value by nbits bits to generate the filter address value where nbits is an integer and defines a number of bits for a phase quantization;

wherein there are NPHASES phases of the plurality of filter characteristics and wherein the resampling factor value is determined by the expression:

$$(A/B) * \text{NPHASES} * 2^{nbits}$$

where A is a value representing a quantity of the first data in the first segment and B is a value representing a quantity of the second data in the second segment.

5. The filter selector as recited in claim 1, wherein the first segment is equal to the second segment and the quantity of the first data is different from the quantity of the second data and the filter selector generates filter address values for producing a zooming effect.

6. The filter selector as recited in claim 1, wherein the first segment is different from the second segment and the filter selector is used to produce filter address values for performing sample rate conversion.

7. A filter selector for generating a filter address value to select one of a plurality of filter characteristics to resample first data from a first segment of data to generate second sampled data in a second segment of data, the filter selector comprising:

means for receiving a resampling factor value having s-bits, r most significant bits and r minus one least significant bits, where s and r are integers;

means for adding a previous adder value to the r minus one least significant bits of the resampling factor value to produce a current adder value and a carryout value;

means for adding a previous filter address value to the r most significant bits of the resampling factor and the carryout value to generate a current filter address value;

means for adding a comparator value to the current filter address value to generate the filter address value if the current filter address value is less than the comparator value; and means for selecting the current filter address value as the filter address value if the current filter address value is greater than or equal to the comparator value.

8. The filter address generator as recited in claim 7, further including means for comparing the current filter address value to the comparator value.

9. The filter address generator as recited in claim 7, wherein the comparator value is equal to the number of filter characteristics.

10. The filter address generator as recited in claim 7, wherein there are NPHASES phases of the plurality of filter characteristics and wherein the resampling factor value is determined by the expression:

$$(A/B) * \text{NPHASES} * 2^{nbits}$$

where A is a value representing the quantity of the first data in the first segment, B is a value representing the quantity of the second data in the second segment, and nbits bits is a resolution of the filter address value.

11. The filter address generator as recited in claim 10, wherein the value of r is equal to the value of nbits.

12. A filter selector for generating a filter address value to select one of a plurality of filter characteristics to resample first data from a first segment of data to generate second sampled data in a second segment of data, the filter selector comprising:

a comparator which compares a previous address value with a comparator value;

a first adder which adds a resampling factor to the previous address value to generate a first address value;

a subtracter which subtracts the comparator value from the previous address value to generate a second address value;

a multiplexer which selects one of (a) the first address value if the address value is less than the comparator value and (b) the second address value if the previous address value is greater than or equal to the comparator value to generate a selected value; and a shifter which shifts the selected value by n bits, where n is an integer, to generate the filter address value.

13. The filter address generator as recited in claim 12, wherein the comparator generates a select signal and the multiplexer selects the one of the first address value and the second address value in response to the select signal.

14. A filter selector for generating a filter address value to select one of a plurality of filter characteristics to resample first data from a first segment of data to generate second sampled data in a second segment of data, the filter selector comprising:

means for receiving a resampling factor value having s-bits, r most significant bits, and r minus one least significant bits, where s and r are integers;

a first adder which adds a previous first adder value to the r minus one least significant bits of the resampling factor value to produce a current adder value and a carryout value;

a second adder which adds a previous filter address value to the r most significant bits of the resampling factor and the carryout value to generate a first address value;

a third adder which adds the comparator value to the current address value to generate a second address value; and a multiplexer which selects one of (a) the first address value if the second address value is less than the comparator value and (b) the second address value if the second filter address value is greater than or equal to the comparator value as the filter address value.

15. The filter address generator as recited in claim 14, wherein the value of r defines a resolution of the filter address value.

16. A method for generating a filter address value to select one of a plurality of filter characteristics to resample first data from a first segment of data to generate second sampled data in a second segment of data, the method comprising the steps of:

adding a resampling factor to a previous address value to generate a current address value if the previous address value is less than a comparator value;

subtracting the comparator value from the previous address value to generate the current address value if the previous address value is greater than or equal to the comparator value; and shifting the current address value by nbits bits to generate the filter address value where nbits is an integer and defines a number of bits for a phase quantization.

17. A method for generating a filter address value to select one of a plurality of filter characteristics to resample first data from a first segment of data to generate second sampled data in a second segment of data, the method comprising the steps of:

adding a resampling factor to a previous address value to generate a current address value if the previous address value is less than a comparator value;

subtracting the comparator value from the previous address value to generate the current address value if the previous address value is greater than or equal to the comparator value; and shifting the current address value by nbits bits to generate the filter address value where nbits is an integer and defines a number of bits for a phase quantization;

wherein there are NPHASES phases of the plurality of filter characteristics and wherein the comparator value is determined by the expression:

$$\text{NPHASES} * 2^{nbits} - C$$

where C is a resampling factor value.

18. A method for generating a filter address value to select one of a plurality of filter characteristics to resample first data from a first segment of data to generate second sampled data in a second segment of data, the method comprising the steps of:

adding a resampling factor to a previous address value to generate a current address value if the previous address value is less than a comparator value:

subtracting the comparator value from the previous address value to generate the current address value if the previous address value is greater than or equal to the comparator value; and shifting the current address value by nbits bits to generate the filter address value where nbits is an integer and defines a number of bits for a phase quantization:

wherein there are NPHASES phases of the plurality of filter characteristics and wherein the resampling factor value is determined by the expression:

$$(A/B) * \text{NPHASES} * 2^{nbits}$$

where A a value representing a quantity of the first data in the first segment and B is a value representing a quantity of the second data in the second segment.

19. A method for generating a filter address value to select one of a plurality of filter characteristics to resample first data from a first segment of data to generate second sampled data in a second segment of data, the method comprising the steps of:

receiving a resampling factor value having s-bits, r most significant bits and r minus one least significant bits where s and r are integers;

adding a previous first adder value to the r minus one least significant bits of the resampling factor value to produce a current adder value and a carryout value;

adding a previous filter address value to the r most significant bits of the resampling factor and the carryout value to generate a first address value;

comparing the second adder value to a comparator value;

adding the comparator value to the current address value to generate a second address value; and selecting one of (a) the first address value if the second address value is less than the comparator value and (b) the second address value if the second filter address value is greater than or equal to the comparator value as the address value.

20. The method as recited in claim 19, wherein the comparator value is the number of the plurality of filter characteristics.

21. The method as recited in claim 19, wherein there are NPHASES phases of the plurality of filter characteristics and wherein the resampling factor value is determined by the expression:

$$(A/B) * \text{NPHASES} * 2^{nbits}$$

where A is a value representing a quantity of the first data in the first segment, B is a value representing a quantity of the second data in the second segment, and nbits is a resolution value of the filter address value.

* * * * *